US010256362B2

(12) United States Patent
Augusto et al.

(10) Patent No.: US 10,256,362 B2
(45) Date of Patent: Apr. 9, 2019

(54) FLEXIBLE SILICON INFRARED EMITTER

(71) Applicant: Arizona Board of Regents on behalf of Arizona State University, Scottsdale, AZ (US)

(72) Inventors: Andre Filipe Rodrigues Augusto, Tempe, AZ (US); Stanislau Herasimenka, Tempe, AZ (US); Stuart Bowden, Tempe, AZ (US)

(73) Assignee: Arizona Board of Regents on Behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 15/665,240

(22) Filed: Jul. 31, 2017

(65) Prior Publication Data
US 2018/0033905 A1     Feb. 1, 2018

Related U.S. Application Data

(60) Provisional application No. 62/368,808, filed on Jul. 29, 2016.

(51) Int. Cl.
*H02S 40/38*     (2014.01)
*H01L 31/00*     (2006.01)
(Continued)

(52) U.S. Cl.
CPC ...... *H01L 31/125* (2013.01); *H01L 31/02008* (2013.01); *H01L 31/0216* (2013.01);
(Continued)

(58) Field of Classification Search
CPC ............ H01L 31/125; H01L 31/0547; H01L 31/02008; H01L 31/0216;
(Continued)

(56) References Cited

U.S. PATENT DOCUMENTS 5,920,078 A    7/1999 Frey
6,504,589 B1   1/2003 Kashima et al.
(Continued)

OTHER PUBLICATIONS

Bowden et al., "High Open-Circuit Voltages on Thin Silicon Solar Cell", 2014, IEEE Xplore, Photovoltaic Specialist Conference (PVSC), 2014 IEEE 40th, pp. 0577-0581, published on Oct. 16, 2014.*
(Continued)

*Primary Examiner* — Nikolay K Yushin
(74) *Attorney, Agent, or Firm* — Quarles & Brady L.L.P.

(57) ABSTRACT

An apparatus includes a flexible silicon (Si) substrate, such as a crystalline n-type substrate, and a heterostructure structure formed on the silicon substrate. The heterojunction structure includes a first layered structured deposited on a first side of the silicon substrate. The first layered structured includes a first amorphous intrinsic silicon layer, an amorphous n-type or p-type silicon layer, and a transparent conductive layer. The second layered structure includes a second amorphous intrinsic silicon layer, an amorphous p-type or n-type silicon layer, and a transparent conductive layer. The heterostructure structure is configured to operate as a photovoltaic cell and an infrared light emitting diode.

7 Claims, 4 Drawing Sheets

(51) Int. Cl.
| | |
|---|---|
| *H01L 33/00* | (2010.01) |
| *H01L 31/12* | (2006.01) |
| *H01L 31/02* | (2006.01) |
| *H01L 31/0376* | (2006.01) |
| *H01L 31/0224* | (2006.01) |
| *H01L 31/18* | (2006.01) |
| *H01L 31/054* | (2014.01) |
| *H01L 31/20* | (2006.01) |
| *H01L 31/0216* | (2014.01) |
| *H01L 31/0352* | (2006.01) |
| *H01L 33/34* | (2010.01) |
| *H01L 33/42* | (2010.01) |
| *H01L 33/46* | (2010.01) |
| *H01L 33/22* | (2010.01) |
| *H01L 33/24* | (2010.01) |
| *H01L 31/042* | (2014.01) |
| *H01L 31/05* | (2014.01) |
| *H01L 31/0747* | (2012.01) |

(52) U.S. Cl.
CPC ........... *H01L 31/022475* (2013.01); *H01L 31/03762* (2013.01); *H01L 31/035281* (2013.01); *H01L 31/042* (2013.01); *H01L 31/0504* (2013.01); *H01L 31/0547* (2014.12); *H01L 31/0747* (2013.01); *H01L 31/1868* (2013.01); *H01L 31/1884* (2013.01); *H01L 31/202* (2013.01); *H01L 33/0058* (2013.01); *H01L 33/0095* (2013.01); *H01L 33/22* (2013.01); *H01L 33/24* (2013.01); *H01L 33/34* (2013.01); *H01L 33/42* (2013.01); *H01L 33/46* (2013.01); *H02S 40/38* (2014.12); *H01L 2933/0016* (2013.01); *H01L 2933/0025* (2013.01)

(58) Field of Classification Search
CPC ..... H01L 31/022475; H01L 31/035281; H01L 31/03762; H01L 31/1868; H01L 31/1884; H01L 31/202; H01L 33/0058; H01L 33/0095; H01L 33/22; H01L 33/24; H01L 33/34; H01L 33/42; H01L 33/46; H02S 40/38; H02S 40/34; H02S 40/22; H02S 40/44; H02S 40/20; H02S 40/42
See application file for complete search history.

(56) References Cited

U.S. PATENT DOCUMENTS

| | | | |
|---|---|---|---|
| 6,570,187 B1 | 5/2003 | Pautrat et al. | |
| 6,924,510 B2 | 8/2005 | Gardner et al. | |
| 6,930,330 B2 | 8/2005 | Choi et al. | |
| 8,049,101 B2* | 11/2011 | Terakawa | H01L 31/0747 136/243 |
| 8,448,876 B2* | 5/2013 | Yang | F24S 10/70 236/1 C |
| 8,809,097 B1* | 8/2014 | Ravi | H01L 31/02167 257/E21.001 |
| 9,257,284 B2* | 2/2016 | Ravi | H01L 31/202 |
| 2005/0017257 A1 | 1/2005 | Green et al. | |
| 2006/0065297 A1* | 3/2006 | Terakawa | H01L 31/0747 136/255 |
| 2010/0314070 A1* | 12/2010 | Yang | G05D 23/19 165/45 |
| 2013/0180578 A1* | 7/2013 | Ravi | H01L 31/202 136/255 |

OTHER PUBLICATIONS

Aberle, A., "Surface Passivation of Crystalline Silicon Solar Cells: a Review", Progress in Photovoltaics: Research and Applications, Sep. 2000, 8(5), pp. 473-487.

De Wolf, S. et al., "High-efficiency Silicon Heterojunction Solar Cells: A Review", Green, 2012, 2(1), pp. 7-24.

Geissbuhler, J. et al., "Amorphous/Crystalline Silicon Interface Defects Induced by Hydrogen Plasma Treatments", Applied Physics Letters, Jun. 2013, 102(23), article 231604, 5 pages, https://doi.org/10.1063/1.4811253.

Green, M. et al., "Efficient Silicon Light-emitting Diodes", Nature, Aug. 2001, vol. 412, pp. 805-808.

Holman, Z. et al., "Infrared Light Management in High-efficiency Silicon Heterojunction and Rear-passivated Solar Cells", Journal of Applied Physics, Jan. 2013, 113(1), article 013107, 14 pages, https://doi.org/10.1063/1.4772975.

Kasemann, M. et al., "Progress in Silicon Solar Cell Characterization with Infrared Imaging Methods", 23rd European Photovoltaic Solar Energy Conference, Sep. 1-5, 2008, Valencia, Spain, pp. 965-973.

King, R. et al., "Band Gap-voltage Offset and Energy Production Innext-generation Multijunction Solar Cells", Progress in Photovoltaics: Research and Applications, Nov. 2011 (available online Nov. 2010, Paper presented at 25th EU PVSEC WCPEC-5, Valencia, Spain, 2010), 19(7), pp. 797-812.

Mews, M. et al., "Hydrogen Plasma Treatments of Amorphous/Crystalline Silicon Heterojunctions", Energy Procedia, Sep. 2014 (4th International Conference on Silicon Photovoltaics, SiliconPV 2014), vol. 55, pp. 827-833.

Pankove, J. et al., "Amorphous Silicon as a Passivant for Crystalline Silicon", Applied Physics Letters, Jan. 1979, 34(2), pp. 156-157.

Pavesi, L., "Routes Toward Silicon-based Lasers", Materials Today, Jan. 2005 (available online Dec. 2004), 8(1), pp. 18-25.

Sawada, T. et al., "High-efficiency a-Si/c-Si Heterojunction Solar Cell", IEEE First World Conference on Photovoltaic Conversion, Dec. 5-9, 1994, Waikoloa, HI, USA.

Terheiden, fr et al., "Manufacturing 100-μm-thick Silicon Solar Cells with Efficiencies Greater than 20% in a Pilot Production Line", Physics Status Solidids A, Jan. 2015 (available online Sep. 2014), 212(1), pp. 13-24.

Tiedje, T. et al., "Limiting Efficiency of Silicon Solar Cells", IEEE Transactions on Electron Devices, May 1984, vol. ed-31, No. 5, pp. 711-716.

Tohoda, S. et al., "Future Directions for Higher-efficiency HIT Solar Cells Using a Thin Silicon Wafer", Journal of Non-Crystalline Solids, Sep. 2012 (available online Apr. 2012), 358(17), pp. 2219-2222.

* cited by examiner

FLEXIBLE SILICON INFRARED EMITTER

CROSS-REFERENCE TO RELATED APPLICATIONS

This is a nonprovisional application claiming the benefit of priority from U.S. Prov. Pat. App. Ser. No. 62/368,808, filed under the same title Jul. 29, 2017, and incorporated in its entirety herein by reference.

STATEMENT OF GOVERNMENT SUPPORTED RESEARCH

This invention was made with government support under 1041895 awarded by the National Science Foundation and under DODRIF13-OEPP01-P-0020 awarded by the Department of Defense. The government has certain rights in the invention.

TECHNICAL FIELD

This disclosure relates generally to devices configured to convert light into electrical energy and to convert electrical energy into light; in particular, this disclosure relates to flexible silicon based solar cells/light emitting diodes utilizing novel heterostructures.

BACKGROUND

Photovoltaic cells and light emitting diodes (LEDs) have a common materials and structural background. Photovoltaic cells receive light from the sun and convert it into usable energy, whereas LEDs convert electrical energy into light. Semiconductors are a key component that enable both these technologies. Semiconducting materials are unique in that their electrical properties can be altered or modified to produce specific outputs. Typically semiconductor devices rely on the movement of charge carriers, such as electrons, within a crystal lattice of atoms. Electrons exist in discrete energy levels, with electrons in the valence energy band being bound to an atom and electrons in the conduction band free to move within the crystal lattice, generating an electric current as a charge carrier. Between these two energy bands is a band gap, an energy level at which no electrons states can exist. The electronic band structure is a characteristic property of the semiconducting material, such as silicon or germanium.

If an electron gains enough energy to overcome the band gap, it can move from the valence band to the conduction band, leaving behind a vacancy in the valence band termed a hole. Electron-hole pairs are the negative and positive charge carriers in semiconductors and are responsible for generating an electric current. Electrons move from the conduction band to the holes in the valence band in a process called recombination. In pure semiconducting material the number of electron-hole pairs are in equilibrium, and the rates of carrier generation and recombination are balanced. In general practice, extrinsic semiconductors are produced when the pure semiconducting material is doped with impurities. Dopant atoms are added that may have surplus electron (n-type) or hole (p-type) concentrations in their valence bands. Thus n-type semiconductors have excess electrons that may move from the valence band to the conduction band, whereas p-type semiconductors have excess holes and can thus accept electrons from the valence band. The accepting or donating of electrons in p-type and n-type materials results in an extrinsic semiconductor having non-neutral charge depending on the dopant material used. The charge equilibrium can thus be selectively modified for use in electronic devices by modifying the rates of carrier generation and recombination. Movement of carriers within extrinsic semiconductors occurs along a potential gradient from the charge differences imparted by n-type and p-type dopants, generating a field current. Currents also arise as carriers move from areas of higher concentration to areas of lower concentration in a diffusion process. Diffusion currents and field currents are not independent, and are often dynamically interacting as charge carrier move through the semiconductor.

The quantum mechanics principles of carrier generation and recombination are important for both LED and photovoltaic cells. In the case of photovoltaic cells, carrier generation can occur through absorption. Photons from sunlight can interact with electrons and excite them to the conduction band, creating a hole in the valence band and generating a free charge carrier. Generally the intensity of the incoming light is proportional to the rate of photon absorption, and not all light that enters a semiconductor will excite an electron to a higher energy band. A similar but reverse process of absorption is termed radiative recombination. Radiative recombination occurs when electrons in the higher energy state of the conduction band recombine with holes in the valence band. During this process, energy is released in the form of a photon—this is the basic operation of an LED.

Each energy band in a semiconductor is characterized by a momentum vector related to the crystal structure of the semiconductor material. For some crystal lattice structures, the maximum energy state of the valence band and the minimum energy state of the conducting band have the same crystal momentum vector, and are termed direct band gap semiconductors, whereas if the crystal momentum vector is different they are indirect band gap semiconductors. The direct or indirect band gap nature of semiconductors has implications for photon absorption and radiative recombination. In indirect band gap materials, such as silicon, an electron needs a change in momentum in addition to a change in energy for light absorption or radiative recombination. Photons transmit energy to electrons but nearly zero momentum, so there is a much lower probability of absorption and radiative recombination in indirect band gap materials. This typically makes indirect band gap materials a poor choice for LEDs, as the effects of radiative recombination (emission of a photon) forms the basis for their operation. The common semiconductor material silicone is an indirect band gap material, and although it is much more common and easily produced than direct gap materials, it is highly inefficient in terms of absorption and radiative recombination and not a typical choice for creating LEDs. Many of the high costs of solar cell production comes from the thickness of the materials required to build them. In addition to size alone, the increased thickness makes solar cells heavy and rigid, limiting where and how they can be deployed and implemented with other technology, such as handheld devices or similar applications. There exists a need for a silicon based, high-voltage thin solar cell and light emitter.

SUMMARY

An apparatus configured to operate as a photovoltaic cell and a light emitting diode, the apparatus comprising a flexible silicon substrate. A heterostructure formed on the silicon substrate includes a first layered structure deposited on a first side of the silicon substrate, the first layered structure including a first passivation layer, a first amorphous silicon layer doped as one of n-type or p-type, and a first transparent conductive layer. It also includes a second layered structure deposited on a second side of the silicon substrate, the second layered structure including a second passivation layer, a second amorphous silicon layer doped as one of n-type or p-type, wherein the second amorphous silicone layer is doped to be an opposite type as the first amorphous silicon layer, and a second transparent conductive layer. It also includes metallization applied to the apparatus for conducting electricity. The flexible silicon substrate may be doped n-type or p-type. The first passivation layer and the second passivation layer may be comprised of intrinsic hydrogenated amorphous silicon. The first transparent conductive layer and the second transparent conductive layer are comprised of indium tin oxide. The silicon substrate may be less than 100 micrometers thick and configured to be flexible during operation of the apparatus. The heterostructure is operable as a photovoltaic cell and as an infrared light emitting diode.

The $V_{oc}$ of the heterostructure is greater than 740 mV when the heterostructure structure is operated as the photovoltaic cell and the infrared light emitting diode. The metallization is formed by screen printing a first layer of silver on the front in a grid pattern, and a second layer of silver on the back in a grid pattern or as a solid pattern. The metallization is formed by copper plating applied to the front face and a copper or silver reflector applied to the rear face. Also included herein is a method of forming a photovoltaic cell and a light emitting diode apparatus. The method includes growing a flexible crystalline silicon substrate, depositing a first layered structure on a first side of the silicon substrate, the first layered structure including a first passivation layer, a first amorphous silicon layer doped as one of n-type or p-type, and a first transparent conductive layer. It also includes depositing a second layered structure on a second side of the silicon substrate, the second layered structure includes a second passivation layer, a second amorphous silicon layer doped as one of n-type or p-type, of the opposite type as the first amorphous silicon layer, and a second transparent conductive layer. The first layered structure and the second layered structure together form a heterostructure on the silicon substrate. Metallization is applied to the apparatus for conducting electricity. In some instances growing the flexible crystalline silicon substrate comprises growing the substrate as a p-doped or n-doped substrate. Further, the method includes treating the first passivation layer with a first hydrogen plasma treatment before depositing the first layered structure on the substrate and treating the second passivation layer with a second hydrogen plasma treatment before depositing the second layered structure on the substrate. The method also includes growing a first silicon substrate to a first thickness larger than 100 micrometers and reducing, through wet alkaline etching and chemical washes, the first silicon substrate to a second thickness of between a few micrometers and 100 micrometers to produce the flexible crystalline silicon substrate. The method also includes applying the metallization by screen printing a first layer of silver over the first side of the substrate in a grid pattern; and sputter depositing a second layer of conductive metal plating over the second side of the substrate. Alternatively the metallization could include applying copper plating the first side of the substrate and sputter depositing a conductive metal reflector over the second side of the substrate.

Also described is a device comprised of a flexible, thin silicon heterostructure cell configured to operate in a first mode as a photovoltaic cell and a second mode as light emitting diode. The first mode comprises converting light to electric energy, and the second mode comprises converting electric energy to emit light. The device also includes an energy storage component configured to store energy generated by the cell when operated in the first mode, and release electric energy to the cell when operated in the second mode. Also included is a controller that switches the cell from the first mode to the second mode. The controller further controls the amount of energy that is released to the cell when operating in the second mode, such that the intensity of the emitted light is adjustable. The thin silicon heterostructure cell of the device includes a first layered structure including a first passivation layer, a first amorphous silicon layer doped as one of n-type or p-type, and a first transparent conductive layer. It also includes a second layered structure including a second passivation layer, a second amorphous silicon layer doped as one of n-type or p-type. The second amorphous silicon layer is doped to be an opposite type as the first amorphous silicon layer. It also includes a second transparent conductive layer. The thin silicon heterostructure cell of the device includes a silicon substrate less than 100 micrometers thick and is configured to be flexible during operation of the apparatus.

DETAILED DESCRIPTION

Figure 1:
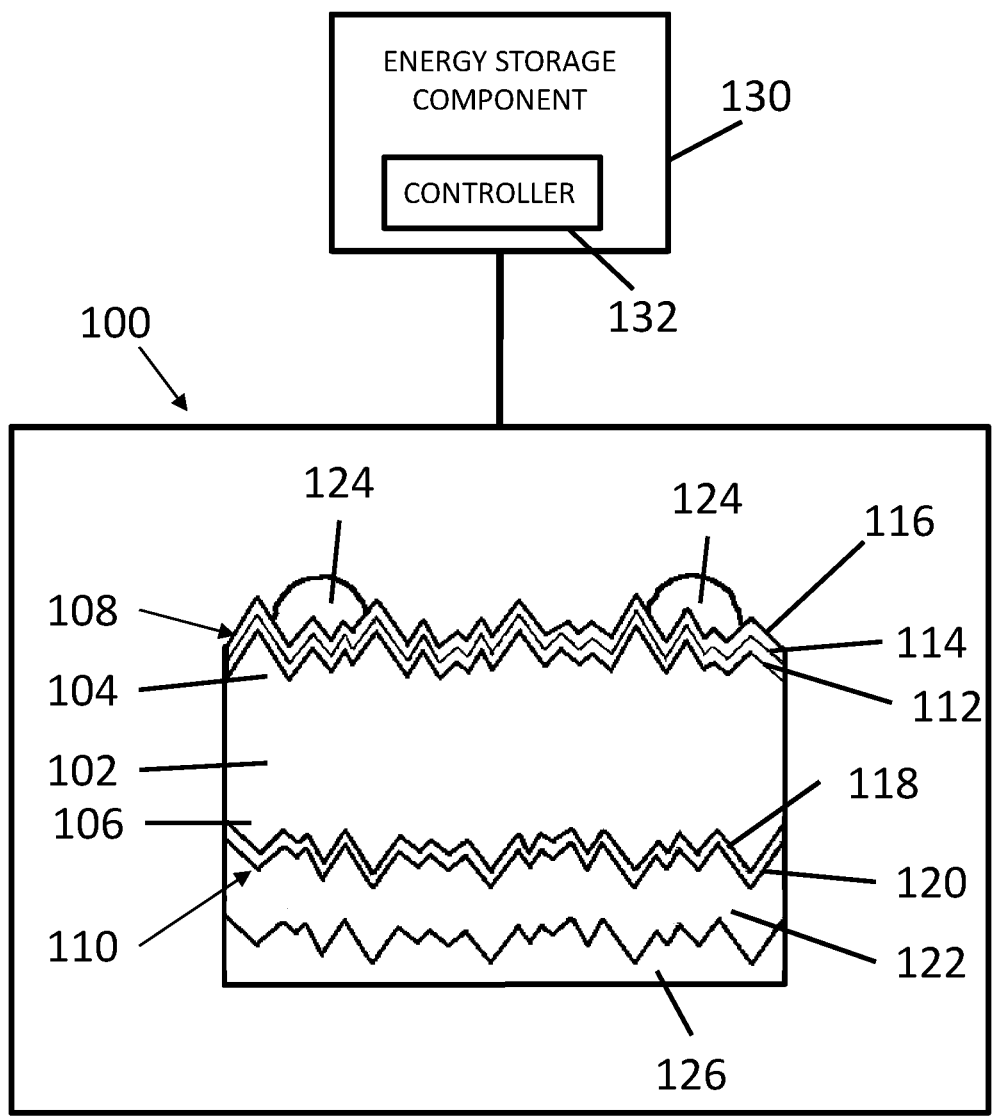
FIG. 1 is a cross-sectional diagrammatic view of an example layer structure of flexible infrared emitter according to the present disclosure.

Typically solar cells are rated by their open circuit voltage ($V_{oc}$), or the maximum available voltage from a particular solar cell. The open circuit voltage depends, in a general sense, on the carrier concentration within the semiconducting material. Higher open circuit voltages are indicative of a solar cell's ability to generate electric power, and is important for a solar cell's efficiency and performance. The open-circuit voltage varies greatly across different materials due to the wide range of energy bandgaps. For comparing the open-circuit voltage of experimental devices made with different materials, a measure that quantifies the quality of the device is the band gap-open voltage offset ($W_{oc}$), where a lower $W_{oc}$ indicates better device quality. The upper limit of open-circuit voltage is dependent on carrier recombination for a given solar cell, which can vary by material and manufacturing choices.

The invention described herein is a thin crystalline silicon semiconductor that operates as a solar cell with high open circuit voltages. Due to the thin structure of the crystalline silicon wafers comprising the cells, they are highly flexible modules that can be operated in a bent position without losing efficiency, generating power from absorbed photons from the sun. The silicon based semiconductive cells are also capable of operating as LEDs when a current is applied, creating a novel hybrid silicon solar cell/light emitter that is highly transportable and flexible. The specific material structure and methods of manufacture of the device enable high open-circuit voltages by operating the cell near the intrinsic limits of carrier recombination.

At the outer surfaces of a semiconductor where the crystal lattice ends, the outermost atoms are not bound on all sides and therefore have unpaired outer shell electrons. The unpaired shells of the atoms on the edge of the surface introduce energy bands in the semiconductor bandgap between the conductive and valence bands of the other atoms in the lattice. These additional energy bands at the edges of the semiconductor create additional recombination sites through a process of surface recombination. As semiconductor wafers become thinner, the effects of surface recombination become more pronounced as surface recombination sites become a larger percentage of the recombination sites in the semiconductor.

Auger recombination is another recombination process that can occur. The difference in crystal momentum between energy bands in indirect bandgap materials means that spontaneous emission of a photon through radiative recombination is less common. In these materials, Auger recombination is the dominant method of recombination, where energy released when an electron drops from the conduction band to the valence band is transferred to a third carrier particle. Thus indirect bandgap materials, such as crystalline silicon, germanium, and gallium-phosphide are limited by Auger recombination rather than radiative recombination, typically making them inappropriate choices for LED devices.

In order to achieve high-voltage solar cells, thinner wafers are required, as the $V_{oc}$ increases as function of the excess carrier density. In order to achieve high open-circuit voltages in thin solar cells near the Auger and radiative recombination limits, reducing the amount of surface recombination is essential. Surface passivation is a process by where the outer surface of a semiconductor may be treated with a material that forms an outer shield and inhibiting surface recombination effects by reducing the number of interface states.

Silicon heterostructure (SHS) solar cell architecture enables remarkable passivation of crystalline silicon materials. A heterostructure is where two layers of materials with different inherent band gaps interface in a semiconductor. In the invention described herein, high quality passivation is achieved by creating a heterostructure where a shield layer of a protective coating material is applied over the crystalline silicone of the solar cell to prevent excess surface recombination. In a preferred embodiment, hydrogenated amorphous silicon (a-Si:H) may be used as the passivation layer, though other materials such as silicon oxide, aluminum oxide, titanium dioxide, silicon carbide, or other suitable choice may be used. Hydrogenated amorphous silicon acts as a buffer layer that separates an area of photon absorption in the semiconductor from highly recombination-active surface areas. Surface passivation is particularly relevant for thinner wafers where recombination at the surface dominates total recombination. In order to achieve higher voltages, improvements in surface passivation and wafer thicknesses are necessary.

Additional layers on the photovoltaic cell/light emitter include transparent conducting oxides (TCOs). These layers are comprised of optically transparent, electrically conductive oxide compositions. These optoelectronic materials serve two main purposes. The first is to improve the lateral movement of charge carriers through the passivation layers. To capture the current that is generated by a photovoltaic cell, it is typically transferred to a power storage device such as power grid or battery through metal contacts attached to the cell. A TCO layer improves the mobility of the charge carriers and improves the efficiency of the cell, while remaining optically transparent so photon may pay through. The other purpose of a TCO is to improve the amount of absorption that occurs in the underlying silicon layer. TCOs have been used in other arts as an anti-reflective coating, and in the present invention serves to enable more light to be absorbed by the underlying layers by decreasing the reflectivity of silicon.

The result of silicon solar cells fabricated with SHS structures and designed to optimize surface passivation and charge carrier mobility is a thin module capable of high $V_{oc}$. The thin structure of preferred embodiments disclosed herein enable silicon photovoltaic cells that are flexible without compromising performance. Cells with a thickness in below 100 µm range have been shown to exhibit flexible properties, though often suffer from brittleness than can introduce cracks or other mechanical deficiencies over time. In preferred embodiments, the cells are less than 70 micrometers (µm) thick and include high quality passivation resulting in greater than 740 millivolts (mV) $V_{OC}$. Further, the structures perform with $W_{OC}$ values below 0.38 mV. To date this is the best $W_{OC}$ measured with indirect bandgap crystalline silicon, and one of the best after thin-film gallium arsenide (GaAs) structures—a direct bandgap material whose environmental and health safety are questionable. Test structures of thin silicon solar cells demonstrating $V_{oc}$ of 760 mV and Woc of 0.35 mV have been measured as well. It is further contemplated that passivated silicon wafers as thin as 5-10 µm may be used in some embodiments.

Turning now to FIG. 1, a schematic representation of a preferred embodiment of a silicon based device 100 that can be operated as a photovoltaic cell (solar cell) or infrared light emitting diode is depicted. The device 100 includes an n-type crystalline silicon (c-Si) wafer 102 as a substrate which includes a first side 104 and a second side 106. Being an n-type wafer, it is electron carrier biased. The wafer is fabricated using the Czochralski (CZ) or epitaxial process of growing silicon crystals. In an example embodiment, wafers with an initial thickness of 145 µm were thinned down to 50 µm via alkaline wet etching, followed by wet chemical cleaning. The device 100 includes an SHS solar cell architecture that includes a first layered structure 108 deposited on the first side 104 of the c-Si wafer 102 and a second layered structure 110 deposited on the second side 106 of the silicon wafer 102. The first layered structure 108 includes a passivation layer formed by intrinsic (unbiased) hydrogenated amorphous silicon (a-Si:H(i)), though other passivation materials such as silicon oxide, aluminum oxide, silicon carbide, or similar may be used in other embodiments. First layered structure 108 includes a first layer of a-Si:H(i) 112 that forms a SHS with side 104 of the c-Si wafer 102 substrate. In an example embodiment, the SHS was formed using plasma enhanced chemical vapor deposition (PECVD) to grow a 15 nm thick layer of a-Si:H(i), though this may be grown to other thicknesses in other embodiments. The intrinsic layer 112 was grown in three steps: first a thinner intrinsic layer (5 nm) was grown, followed by hydrogen plasma treatment (HPT), and finally a thicker layer of 10 nm was grown on top. The hydrogen plasma treatment process increases the passivation performance of the a-Si:H (i), though may not be necessary in all embodiments. The performance increase when HPT is applied is due to improved carrier lifetime by a diffusion of hydrogen atoms to the interface of the a-Si:H(i) 112 layer and side 104 of c-silicon wafer 102 substrate. This diffusion provides improved chemical passivation due to dangling bond saturation. A thinner intrinsic layer was grown first in order to promote a proper diffusion of the hydrogen to the a-Si:H(i) 112/c-Si-interface 104 interface. A second layer in the first layered structure 108 is a p-doped (hole biased) hydrogenated amorphous silicon layer (a-Si:H (p+)) 114. Exemplary embodiments will have a thickness of 7-10 nm for the p-doped a-Si:H (p+) layer 114. A third layer in the first layered structure 108 is a transparent conductive material layer. In a preferred embodiment, a third layer includes a first indium tin oxide (ITO) layer 116 that is sputter deposited. ITO is an optically transparent, electrically conductive oxide composition that improves mobility of charge carriers from metal contacts 124 to a-Si layers, though one skilled in the arts would understand a number of conductive materials with transparent properties such as indium zinc oxide, hydrogenated indium oxide, zirconium doped indium oxide, zinc oxide, or similar may be used in alternate embodiments. ITO has anti-reflective properties and serves to enable more light to be absorbed by the underlying layers by decreasing the reflectivity of silicon. The front ITO layer 116 is kept thin enough to act as an anti-reflective coating; exemplary embodiments may have a thickness of 80 nm, though the thickness may be optimized for specific wavelengths of light as the reflectivity is wavelength-dependent. The front of the cell is where carriers are generated by light incident on the cell, and that is where most of the absorption should occur by underlying layers. Applying a front transparent conducting layer, such as an ITO layer, improves current generation and improves the efficiency and performance of the cell. The second layered structure 110 includes a first layer of a second passivation material 118, such as a-Si:H (i) in a preferred embodiment depicted in FIG. 1, that is grown on the second side 106 of the silicon wafer 102 substrate in a manner like a-Si:H (i) passivation layer 112. A second layer in the second layered structure 110 is an n-doped hydrogenated amorphous silicon layer (a-Si:H (n+)) 120. A third layer in the second layered structure 110 is a second indium tin oxide (ITO) layer 122 that is sputter deposited. A layer of ITO 122 is on the rear provides improved charge collection as a result of increased carrier mobility, which results in higher $V_{oc}$.

To collect the charges from the solar cell, and to connect multiple cells to create a module, metallization of the cell is required. Metallization provides a contact where charge from the photovoltaic functionality can be collected, such as by a battery or electric grid. An energy storage component 130 may be configured to store energy generated by the cell when operated in a first mode that comprises converting light to electric energy, and may be configured to release energy to the cell when operated in a second mode that comprises converting electric energy to emit light. A controller 132 may switch between the first mode and the second mode. The metallization also provides conductive contacts where external current can be applied to cause the cell to emit light as an LED. Screen printing metal is a popular method of metallization when manufacturing solar cells. In example embodiment 100, metallization parameters are different for the front and the rear of the solar cell. Front contacts 124 are silver (Ag) paste screen printed on the surface in a square grid pattern. The rear contact 126 is sputtered Ag giving full coverage of the rear surface, providing large contact surface as well as reflective properties to reflect photons back into the semiconductive silicon layer, improving the efficiency of the photovoltaic functionality. It is noted that a variety of conductive metals may be used in alternate embodiments, such as copper, and that the orientation of the metallization may be changed depending on how the cell may be used. For example, some commercial solar or electric companies have infrastructure supporting bifacial screen printed metallization as depicted in FIG. 1. Other embodiments may be metallized using interdigitized back contact, where all conductive contacts are applied only to the rear of the cell. This may reduce shading losses introduced by the non-transparent metal on the front face of the cell.

Figure 2:
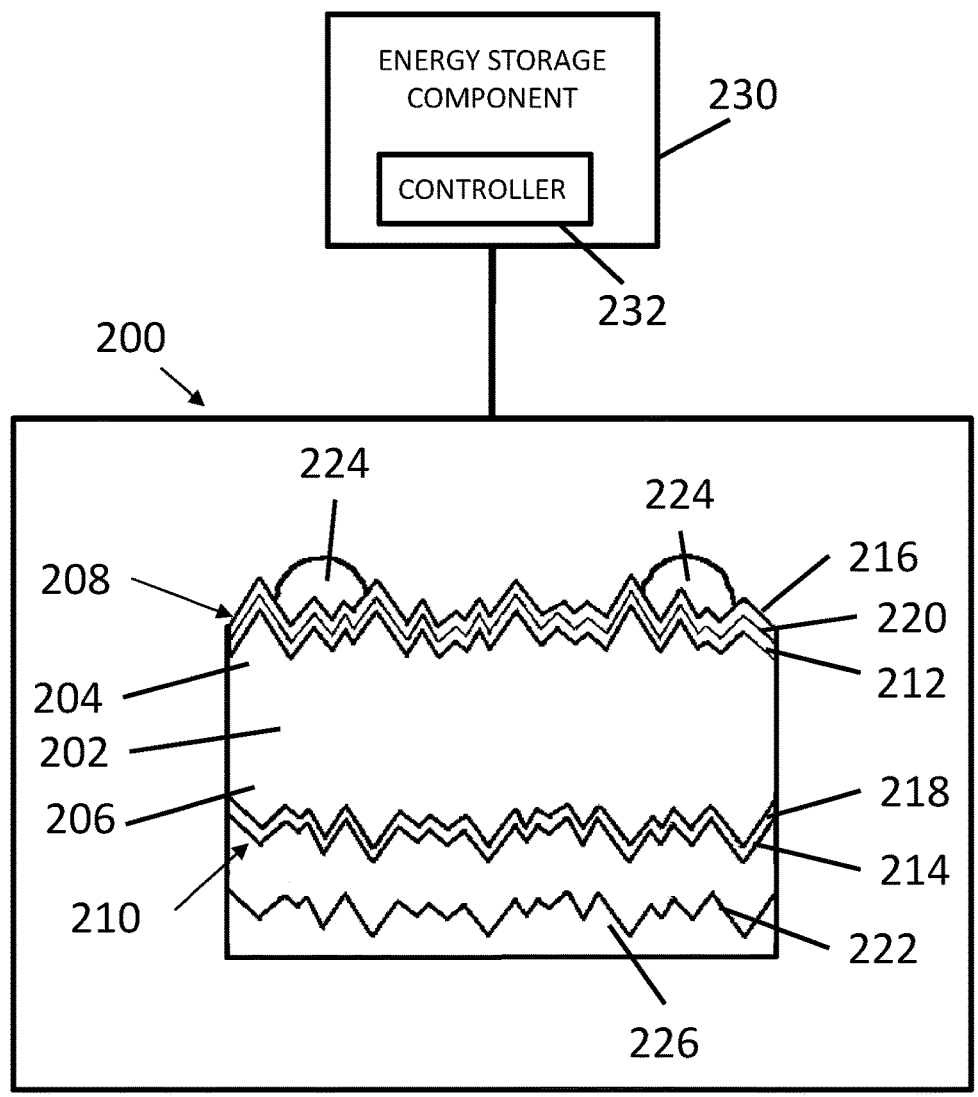
FIG. 2 is a cross-sectional diagrammatic view of another example layer structure of flexible infrared emitter according to the present disclosure.

Turning now to FIG. 2, an alternate embodiment of a device 200 is depicted. The device 200 includes the same components and symmetrical layers as those of the device 100 of FIG. 1, except that the device 200 is configured in a rear junction configuration. The device 200 includes an SHS comprising a first layered structure 208 on a first side 204 of a silicon wafer substrate 202 (i.e., the side of the substrate 202 that faces front contacts 224). The first layered structure 208 includes: a first passivation layer 212, a-Si:H (i) in this embodiment, that is grown on the first side 204 of the silicon wafer 202 substrate; a a-Si:H (n+) layer 220 deposited over the silicon layer 212; and, a first transparent conductive layer 216 of indium tin oxide (ITO) layer 216 that is sputter deposited over the silicon layer 220. Front contacts 224 of, e.g., silver (Ag) paste are screen printed onto the first layered structure 208. A second layered structure 210 on the second side 206 of the wafer substrate 202 forms a second SHS, and includes: a second passivation layer 218 of a-Si:H (i) that is grown on the second side 206; a a-Si:H (p+) layer 214 positioned over the silicon layer 218; and, a second transparent conductive layer 222 of ITO that is sputter deposited over the silicon layer 214. A rear reflector 226, which may be sputtered Ag, is deposited over the second layered structure 210. Device 200 is configured with the p-doped layer 214 and the n-doped layer 220 reversed, in comparison to the device 100 of FIG. 1, thus placing the junction adjacent the second side 206 of the silicon wafer substrate 202. An energy storage component 230 may be configured to store energy generated by the cell when operated in a first mode that comprises converting light to electric energy, and may be configured to release energy to the cell when operated in a second mode that comprises converting electric energy to emit light. A controller 232 may switch between the first mode and the second mode. The remaining components and layers may remain the same.

It is contemplated that low power hydrogen plasma treatments may be used on the first and second passivation layers (in the example embodiment, intrinsic hydrogenated amorphous silicon layers a-Si:H (i) 112, 118) to improve surface passivation. Further, the second transparent conductive layer is contemplated to be much thicker than the first transparent conductive layer. In the example embodiment, ITO layer 122 is thicker than ITO layer 116. In some embodiments the second transparent conductive layer 122 may be about 280 nanometers (nm) thick. One having ordinary skill in the art will understand that by simply switching the deposition of the thicker second transparent conductive ITO layer 122 and rear reflector 126 with the first transparent conductive ITO layer 116 and front contacts 124, the device 100 is converted to the device 200.

Figure 3:
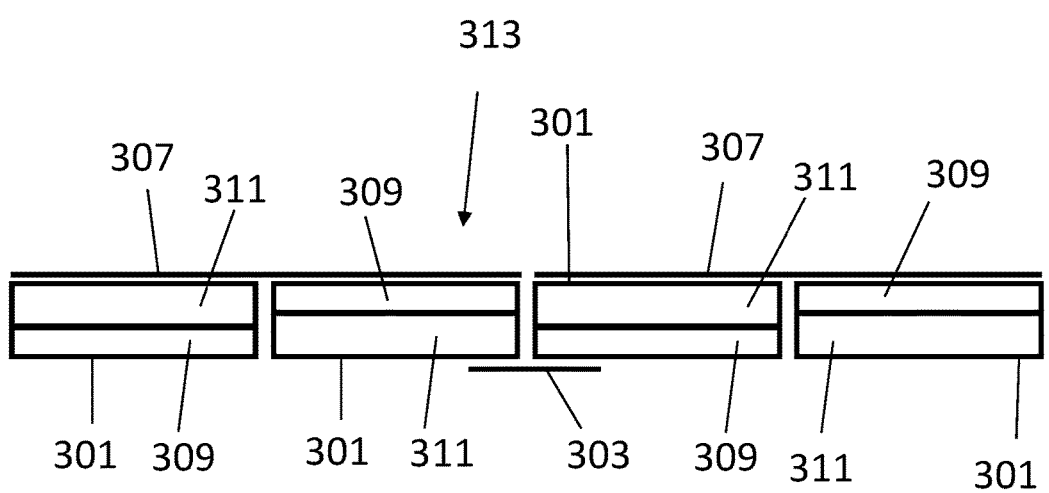
FIG. 3 is a side view schematic of solar cells connected in series, in accordance with the present disclosure.
Figure 4:
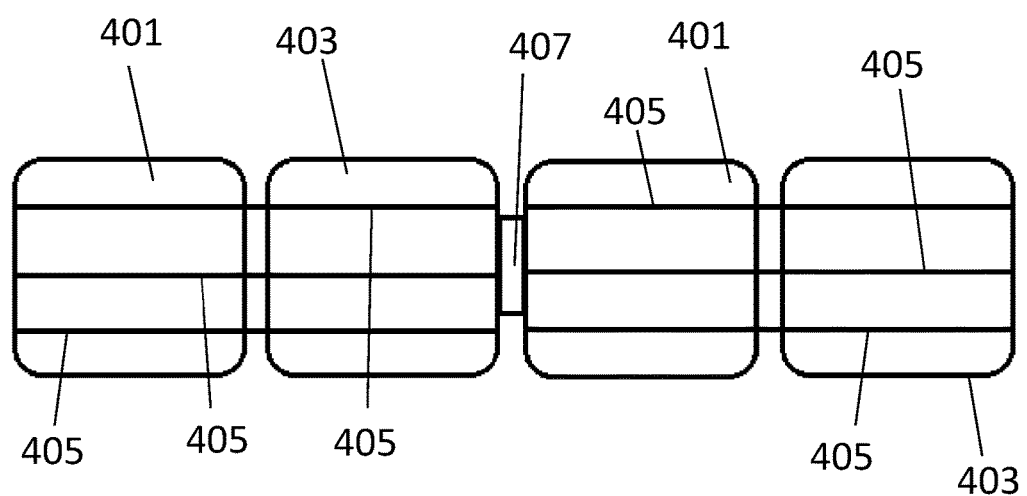
FIG. 4 is a top view of FIG. 3 showing solar cells connected in series, in accordance with the present disclosure.

Further, one having ordinary skill in the art would understand how the structures depicted in FIGS. 1 and 2 may be scaled up in size to form a large area solar cell that can also function as a light emitting diode. Further, the flexibility of the device can be determined by the thickness of the silicon wafer 102 substrate. Due to the symmetry of devices 100 and 200 they exhibit similar electrical performance with either the a-Si:H (n+) or a-Si:H (p+) layer on the front of the cell. This enables the cells to be connected in series in a front-to-front and back-to-back orientation to form larger module. FIG. 3 depicts a schematic of side view of an example embodiment of these connections. Four SHS solar cell/light emitters 301 are connected in series. Each cell 301 has n-type 311 and p-type 309 layers, and cells are connected adjacently with every other cell flipped over, so alternating n-type and p-type layers face the front 313. In this example embodiment, indium coated wires 307 connect the metalized contacts on the front face of each cell. In other embodiments, metallic ribbons may be soldered or adhesively applied to metal contacts on each cell to connect them in series, or other similar methods of conductively connecting cells together. Rear connection 303 connects the back of adjacent cells in series connection. FIG. 4 is a top view of the connection scheme depicted in the FIG. 3, looking at the front face 313 from above. Here SHS cells with n-type layer 401 facing front are connected to adjacent cells with p-type layer 403 facing front. Indium coated wired 405 are used to connect the metal contacts on the front face of each cell, and rear connection 407 connects the back of each adjacent cell. The alternating cells enables more reliable and easier assembly of the devices. Additionally, it reduces the stress on the cells when they are mechanically flexed.

Silicon solar cells were fabricated to form devices on a silicon wafer substrates that are between 40 and 75 micrometers thick. Specifically, optimal flexibility was observed when wafers were less than 70 micrometers thick. Such thin cells was possible through high quality passivation layers and the SHS structure. The thin silicon wafers make it possible to push the open-circuit voltages near the Auger and surface recombination limits; the solar cells as fabricated have $V_{oc}$ between 730 mV and 750 mV, and efficiencies greater than eighteen percent (>18%). The best LEDs are typically constructed from direct bandgap materials like gallium arsenide, and indirect bandgap materials are typically reserved for other semiconductor applications. The outer limits of other forms of recombination generally limit the radiative recombination possible in indirect bandgap materials. Because of the operating characteristics of the current device, these solar cells are near the out limits of these other recombination processes, and are able to exhibit radiative emission in the infrared spectrum and can function as large area light emitting diodes, a novel device using an indirect bandgap material like silicon. When current is applied to the metal contacts on the photovoltaic cell, photons are emitted through radiative emission. Operation of the current photovoltaic cell as an LED is controlled by the application of electric current; when current is applied light is emitted, and ceases when current is removed. The intensity of the emitted light is proportional to the current amplitude. By changing the applied current the intensity of light can be altered without the need to fully turn off the light, and the cell responds very quickly to current changes. This enables the cell to be used for Morse code or as a flashing rescue beacon, for example.

In an example embodiment, a solar cell approximately 153 cm$^2$ was able to emit light that was detected at over 40 meters, though it is to be understood by those skilled in the arts that this size and range can be scaled in size. The cell was operated in the flexed position without compromising performance, indicating the flexible nature of the device. At the thickness of 70 µm, the radius of curvature was a significant fraction (approximately one-half or more) of the length of the device.

It is contemplated that this technology has numerous applications in communications, illumination, and with the military. The technology required to create the devices incorporates standard silicon device processing technology that is low cost and scalable with high manufacturing output. The design described herein enables a device that may be scalable between a few square centimeters up to several square meters in size. The LED technology enables LEDs with large areas without significant effort or changes to processing. The LED in this example has an emission predominantly between 1100 and 1200 nm at room temperature (300K), an LED that is flexible and also operates as a solar cell is produced that may have significant industrial applications. One non-limiting embodiment may include an IR LED that can be located remotely and does not need a separate component to charge batteries, thus saving cost and device complications.

This invention demonstrates bandgap-voltage offsets in crystalline silicon devices comparable with the best reported for direct bandgap materials such as GaAs and GaInP, which have higher bandgaps and voltages. By utilizing 50 µm-thick Czochralski silicon wafers, high quality a-Si surface passivation, and a low surface damage sputtering process it was possible to preserve the initial high minority-carrier lifetime and surpass the hurdle of a 760 mV open-circuit voltage.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification is not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. A method of forming a photovoltaic cell and a light emitting diode apparatus, the method comprising:
   growing a flexible crystalline silicon substrate;
   depositing a first layered structure on a first side of the flexible crystalline silicon substrate, the first layered structure including a first passivation layer, a first amorphous silicon layer doped as one of n-type or p-type, and a first transparent conductive layer;
   treating a portion of the first passivation layer with a first hydrogen plasma treatment before depositing the first amorphous silicon layer and the first transparent conductive layer of the first layered structure on the flexible crystalline silicon substrate;
   depositing a second layered structure on a second side of the flexible crystalline silicon substrate, the second layered structure including a second passivation layer, a second amorphous silicon layer doped as one of n-type or p-type, wherein the second amorphous silicon layer is doped to be an opposite type as the first amorphous silicon layer, and a second transparent conductive layer, the first layered structure and the second layered structure together forming a heterostructure on the flexible crystalline silicon substrate;
   treating a portion of the second passivation layer with a second hydrogen plasma treatment before depositing the second amorphous silicon layer and the second transparent conductive layer of the second layered structure on the flexible crystalline silicon substrate; and
   applying metallization to the apparatus for conducting electricity.

2. The method of claim 1, wherein growing the flexible crystalline silicon substrate comprises growing the flexible crystalline silicon substrate as a p-doped or n-doped substrate.

3. The method according to claim 1, wherein growing the flexible crystalline silicon substrate comprises:
   growing a first silicon substrate to a first thickness larger than 100 micrometers; and
   reducing, through wet alkaline etching and chemical washes, the first silicon substrate to a second thickness of between a few micrometers and 100 micrometers to produce the flexible crystalline silicon substrate.

4. The method according to claim 1, wherein applying the metallization comprises:
   screen printing a first layer of silver over the first side of the flexible crystalline substrate in a grid pattern; and
   sputter depositing a second layer of conductive metal plating over the second side of the flexible crystalline substrate.

5. The method according to claim 1, wherein applying the metallization comprises:
   copper plating the first side of the flexible crystalline substrate; and
   sputter depositing a conductive metal reflector over the second side of the flexible crystalline substrate.

6. The method of claim 1, further comprising:
   depositing the first passivation layer by:
      depositing a first intrinsic amorphous silicon layer before the first hydrogen plasma treatment;
      depositing a second intrinsic amorphous silicon layer after the first hydrogen plasma treatment.

7. The method of claim 6, wherein the second intrinsic amorphous silicon layer is thicker than the first intrinsic amorphous silicon layer.

* * * * *